(12) United States Patent
Lim et al.

(10) Patent No.: US 12,506,018 B2
(45) Date of Patent: Dec. 23, 2025

(54) APPARATUS AND METHOD FOR TREATING SUBSTRATE

(71) Applicant: SEMES CO., LTD., Cheonan-si (KR)

(72) Inventors: Eui Sang Lim, Cheonan-si (KR); Young Hun Lee, Cheonan-si (KR); Jinwoo Jung, Seoul (KR); Miso Park, Daejeon (KR); Byongwook Ahn, Seoul (KR); Yong Hee Lee, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 3 days.

(21) Appl. No.: 18/407,848

(22) Filed: Jan. 9, 2024

(65) Prior Publication Data

US 2024/0145261 A1  May 2, 2024

Related U.S. Application Data (62) Division of application No. 17/063,820, filed on Oct. 6, 2020, now Pat. No. 11,942,337.

(30) Foreign Application Priority Data

Oct. 7, 2019 (KR) .................. 10-2019-0124112

(51) Int. Cl.
*H01L 21/67* (2006.01)
*H01J 37/32* (2006.01)

(52) U.S. Cl.
CPC .. *H01L 21/67017* (2013.01); *H01J 37/32449* (2013.01); *H01J 37/32467* (2013.01);
(Continued)

(58) Field of Classification Search
None
See application file for complete search history.

(56) References Cited

U.S. PATENT DOCUMENTS

| | | | |
|---|---|---|---|
| 2005/0189001 A1* | 9/2005 | Lin | B08B 7/0021 257/E21.228 |
| 2007/0113866 A1* | 5/2007 | Chovino | G03F 7/70925 134/1 |

(Continued)

FOREIGN PATENT DOCUMENTS

| | | |
|---|---|---|
| JP | 2004-249189 A | 9/2004 |
| JP | 2004-527110 A | 9/2004 |

(Continued)

OTHER PUBLICATIONS

Office Action for Korean Application No. 10-2019-0124112 dated Jun. 3, 2021.

(Continued)

*Primary Examiner* — Khaja Ahmad
(74) *Attorney, Agent, or Firm* — HARNESS, DICKEY & PIERCE, P.L.C.

(57) ABSTRACT

The apparatus includes a support unit to support the substrate in a treatment space of a process chamber, a first fluid supply unit to supply a supercritical fluid having an organic solvent dissolved in the supercritical fluid, to the treatment space, a second fluid supply unit to supply the supercritical fluid having no organic solvent dissolved in the supercritical fluid, to the treatment space, an exhaust unit to exhaust the treatment space, a controller to control the first fluid supply unit, the second fluid supply unit, and the exhaust unit. The controller controls the first and second fluid supply units such that the supercritical fluid having no organic solvent dissolved in the supercritical fluid is supplied to the treatment space through the second fluid supply unit, after the supercritical fluid mixed with the organic solvent is supplied to the treatment space through the first fluid supply unit.

20 Claims, 8 Drawing Sheets

(52) U.S. Cl.
CPC .. *H01J 37/32715* (2013.01); *H01J 37/32834* (2013.01); *H01J 2237/334* (2013.01)

(56) References Cited

U.S. PATENT DOCUMENTS

| | | | |
|---|---|---|---|
| 2012/0196445 A1* | 8/2012 | Lim | B81C 1/00928 |
| | | | 156/345.29 |
| 2013/0000140 A1* | 1/2013 | Jung | H01L 21/67017 |
| | | | 34/523 |
| 2014/0000659 A1* | 1/2014 | Lee | H01L 21/67075 |
| | | | 134/99.1 |
| 2016/0334162 A1* | 11/2016 | Kim | H01L 21/67109 |
| 2017/0018442 A1 | 1/2017 | Oh et al. | |
| 2017/0117137 A1 | 4/2017 | Bang et al. | |
| 2017/0274415 A1 | 9/2017 | Kim et al. | |
| 2017/0345680 A1 | 11/2017 | Lee et al. | |
| 2018/0012755 A1 | 1/2018 | Lee et al. | |
| 2018/0033632 A1 | 2/2018 | Park et al. | |
| 2018/0033655 A1* | 2/2018 | Kim | B08B 7/0021 |
| 2018/0061649 A1 | 3/2018 | Park et al. | |
| 2018/0323064 A1* | 11/2018 | Jung | H01L 21/67109 |

FOREIGN PATENT DOCUMENTS

| | | |
|---|---|---|
| JP | 2005-525706 A | 8/2005 |
| JP | 2006-513582 A | 4/2006 |
| JP | 2012-243776 A | 12/2012 |
| JP | 2018-78200 A | 5/2018 |
| JP | 2018-82099 A | 5/2018 |
| KR | 100597656 B1 | 7/2006 |
| KR | 100744145 B1 | 8/2007 |
| KR | 10-0835752 B1 | 6/2008 |
| KR | 2018-0101850 A | 9/2018 |
| KR | 2018-0116802 A | 10/2018 |
| KR | 2020-0001481 A | 1/2020 |

OTHER PUBLICATIONS

Japanese Office Action dated Oct. 25, 2022 for corresponding Japanese Application No. 2020-165921.

* cited by examiner

APPARATUS AND METHOD FOR TREATING SUBSTRATE

CROSS-REFERENCE TO RELATED APPLICATIONS

This application is a divisional of U.S. application Ser. No. 17/063,820, filed Oct. 6, 2020, which claims priority under 35 U.S.C. § 119 is made to Korean Patent Application No. 10-2019-0124112 filed on Oct. 7, 2019, in the Korean Intellectual Property Office, the entire contents of each of which are hereby incorporated by reference.

BACKGROUND

Embodiments of the inventive concept described herein related to an apparatus and a method for treating a substrate, and more particularly to an apparatus and a method for treating a substrate by using a supercritical fluid.

In general, a device, such as a semiconductor, is fabricated from a substrate such as a wafer. In detail, a semiconductor device is fabricated by forming a fine circuit pattern on a top surface of the substrate through a deposition process, a photolithography process, or an etch process.

As the processes are performed, various foreign matters stick to the top surface of the substrate having the circuit pattern. Accordingly, a cleaning process is performed in the middle of the processes to remove the foreign matters from the substrate.

In general, the cleaning process includes a chemical treatment process to remove foreign matters from the substrate by supplying chemicals to the substrate, a rinse treatment process to remove the chemicals remaining on the substrate by supplying pure water to the substrate, and a drying treatment process to remove the pure water remaining on the substrate.

A supercritical fluid is used for the drying treatment process for the substrate. According to an embodiment, after replacing pure water, which is present on a substrate, with an organic solvent, the supercritical fluid is supplied to the top surface of the substrate in a high pressure chamber to dissolve the organic solvent, which remains on the substrate, in the supercritical fluid, thereby removing the organic solvent from the substrate. When isopropyl alcohol (hereinafter, IPA) is used as the organic solvent, carbon dioxide ($CO_2$) is used as the supercritical fluid, because the carbon dioxide is relatively low in critical temperature and critical pressure and excellently dissolves the IPA.

The treatment for the substrate using the supercritical fluid is performed as follows. When the substrate is introduced into the high pressure chamber, $CO_2$ in the supercritical state is supplied into the high pressure chamber to pressurize the inner part of the high pressure chamber. Thereafter, the supply of the supercritical fluid and the exhaust of the high pressure chamber are repeated such that the substrate is treated using the supercritical fluid. In addition, when the treatment for the substrate is completed, the inner part of the high pressure chamber is exhausted, and pressure is reduced.

A conventional drying process for a substrate using a supercritical fluid is performed by supplying $CO_2$ to a process chamber at the high temperature of 100° C. or higher to dry the IPA on the substrate. In this case, in the chamber, the IPA may be dried by high-pressure $CO_2$ before dissolved in $CO_2$.

As the IPA is dried from the pattern surface of the substrate, a leaning phenomenon may occur. To prevent the phenomenon, an IPA supply is increased. When the process time is prolonged to reduce the IPA remaining on the substrate in the drying process, the price of the semiconductor is increased, and the yield rate is decreased.

In addition, when $CO_2$ is injected into the chamber in the conventional drying process for the substrate using the supercritical fluid, the treatment process of changing the pressure of $CO_2$ is repeatedly performed to increase the solubility of IPA in $CO_2$. However, the treatment process may be prolonged because a long time is taken until the IPA makes contact with $CO_2$ and reacts with the $CO_2$ in the process that the IPA is dissolved in the $CO_2$.

SUMMARY

Embodiments of the inventive concept provide an apparatus and a method for treating a substrate, capable of improving treatment efficiency for a substrate when treating the substrate using a supercritical fluid.

Embodiments of the inventive concept provide an apparatus and a method for treating a substrate, capable of supplying a supercritical fluid having an organic solvent dissolved therein when drying the substrate using the supercritical fluid.

The objects which will be achieved in the inventive concept are not limited to the above, but other objects, which are not mentioned, will be apparently understood to those skilled in the art.

According to an exemplary embodiment, an apparatus for treating a substrate may include a process chamber having a treatment space inside the process chamber, a support unit to support the substrate in the treatment space, a first fluid supply unit to supply, to the treatment space, a supercritical fluid having an organic solvent dissolved in the supercritical fluid, a second fluid supply unit to supply, to the treatment space, the supercritical fluid having no organic solvent dissolved in the supercritical fluid, an exhaust unit to exhaust the treatment space, and a controller to control the first fluid supply unit, the second fluid supply unit, and the exhaust unit. The controller may control the first fluid supply unit and the second fluid supply unit such that the supercritical fluid having no organic solvent dissolved in the supercritical fluid is supplied to the treatment space through the second fluid supply unit, after the supercritical fluid mixed with the organic solvent is supplied to the treatment space through the first fluid supply unit.

According to an embodiment, the first fluid supply unit may include a mixing tank, a first supercritical fluid supply line to supply the supercritical fluid to the mixing tank, an organic solvent supply unit to supply the organic solvent to the mixing tank, and a first supply line to supply, to the treatment space, the supercritical fluid mixed with the organic solvent in the mixing tank.

According to an embodiment, the second fluid supply unit may include a reservoir to store the supercritical fluid, a second supercritical fluid supply line to supply the supercritical fluid to the reservoir, and a second supply line to supply, to the treatment space, the supercritical fluid in the reservoir.

According to an embodiment, the controller may control the first fluid supply unit to adjust a mixing ratio of the supercritical fluid supplied to the treatment space and having the organic solvent dissolved in the supercritical fluid, such that the organic solvent is provided to 1 wt % or less in the treatment space.

According to an embodiment, a first fluid may be a carbon dioxide ($CO_2$), and a second fluid may be isopropyl alcohol.

According to another exemplary embodiment, a method for treating a substrate may include sequentially performing pressurizing a treatment space by supplying a supercritical fluid after the substrate is introduced into the treatment space, treating the substrate using the supercritical fluid by supplying the supercritical fluid to the treatment space, and reducing pressure by exhausting the supercritical fluid out of the treatment space after the substrate is completely treated. The supercritical fluid and the organic solvent may be simultaneously supplied to the treatment space in pressurizing the substrate.

According to an embodiment, the pressurizing may include supplying the organic solvent to the treatment space in a state that the organic solvent is dissolved in the supercritical fluid.

According to an embodiment, the treating may include supplying only the supercritical fluid to the treatment space, without the organic solvent.

According to an embodiment, the pressurizing may include adjusting a mixing ratio of the supercritical fluid supplied to the treatment space and having the organic solvent dissolved in the supercritical fluid, such that the organic solvent is provided to be 1 wt % or less in the treatment space.

According to an embodiment, the supercritical fluid may be carbon dioxide, and the organic solvent may be isopropyl alcohol.

According to an embodiment, a method for treating a substrate may include removing an organic solvent, which remains, from the substrate by supplying a supercritical fluid onto the substrate, in which the substrate is introduced into the treatment space, the supercritical fluid having the organic solvent dissolved in the supercritical fluid is supplied to the treatment space, and then the supercritical fluid having no organic solvent is supplied to the treatment space.

According to an embodiment, the supercritical fluid having the organic solvent dissolved in the supercritical fluid may be supplied to the treatment space, after the organic solvent is dissolved in the supercritical fluid outside the treatment space.

According to an embodiment, a mixing ratio of the supercritical fluid supplied to the treatment space and having the organic solvent, which is dissolved in the supercritical fluid, may be adjusted such that the organic solvent is provided to 1 wt % or less in the treatment space.

According to an embodiment, the supercritical fluid may be carbon dioxide, and the organic solvent may be isopropyl alcohol.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Figure 1:
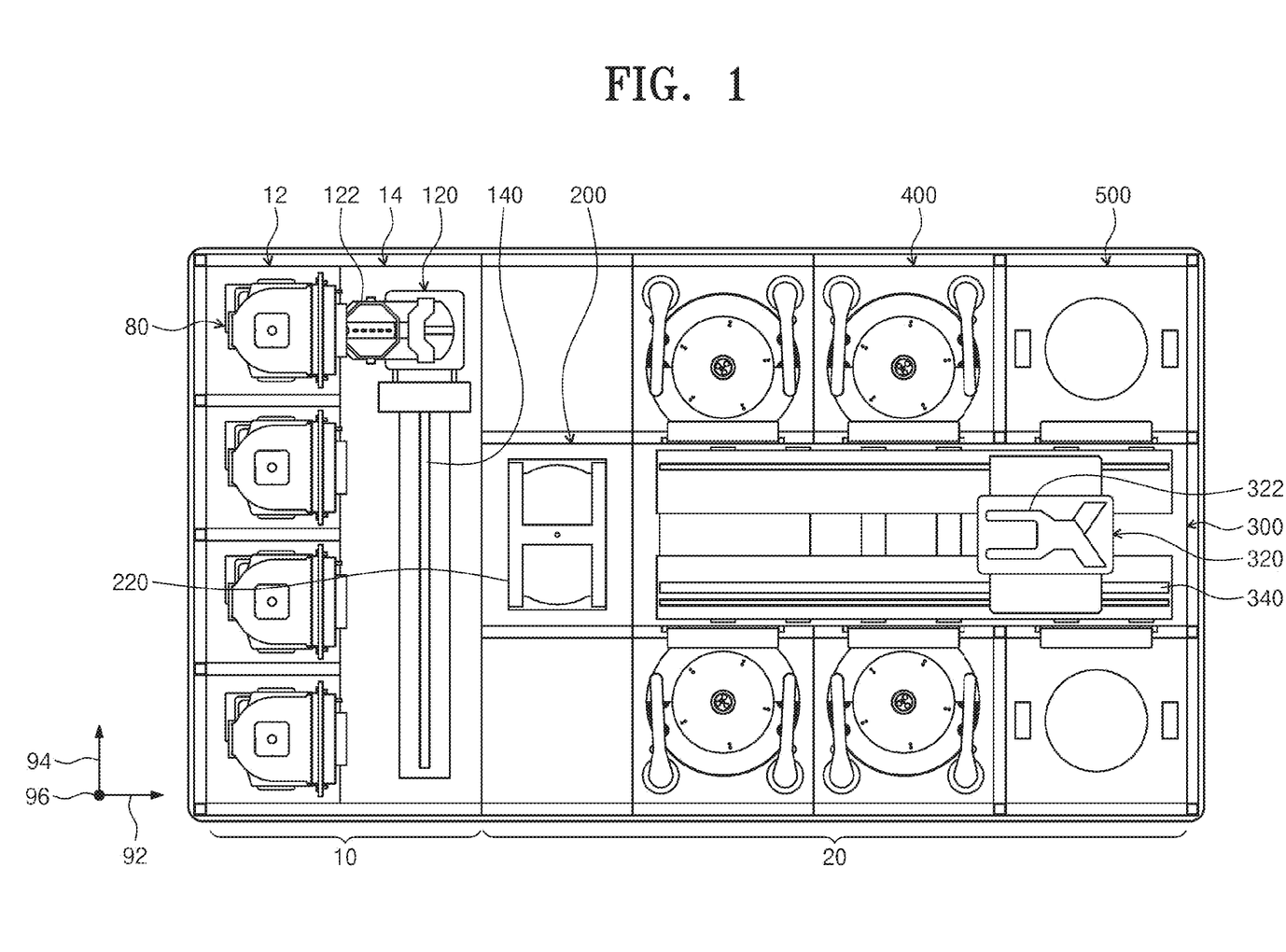
FIG. 1 is a view schematically illustrating an apparatus for treating a substrate, according to an embodiment of the inventive concept.

FIG. 1 is a view schematically illustrating an apparatus (hereinafter, a substrate treatment apparatus) for treating a substrate, according to an embodiment of the inventive concept. Referring to FIG. 1, a substrate treatment system includes an index module 10, a treating module 20, and a controller (not illustrated). According to an embodiment, the index module 10 and the treating module 20 are disposed in one direction. Hereinafter, a direction in which the index module 10 and the treating module 20 are arranged will be referred to as a first direction 92, a direction that is perpendicular to the first direction 92 when viewed from above will be referred to as a second direction 94, and a direction perpendicular to all the first direction 92 and the second direction 94 will be referred to as a third direction 96.

The index module 10 carries a substrate 'W' to the treating module 20 from a container 80 having the substrate 'W' received therein, and a substrate 'W' completely treated in the treating module 20 is received into the container 80. The longitudinal direction of the index module 10 is provided in the second direction 94. The index module 10 has a loadport 12 and an index frame 14. The loadport 12 is positioned at an opposite side of the treating module 20, based on the index frame 14. The container 80 having substrates 'W' is placed in the loadport 12. A plurality of loadports 12 may be provided and may be arranged in the second direction 94.

The container 80 may include a container for sealing such as a front open unified pod (FOUP). The container 80 may be placed on the loadport 12 by a transfer unit (not illustrated) such as Overhead Transfer, Overhead Conveyor, or Automatic Guided Vehicle or a worker.

An index robot 120 is provided inside the index frame 14. A guide rail 140, which has a longitudinal direction provided in the second direction 94, may be provided in the index frame 14, and the index robot 120 may be provided to be movable on the guide rail 140. The index robot 120 may include a hand 122 in which the substrate 'W' is positioned, and the hand 122 may be provided to be movable forward and backward, rotatable about the third direction 96, and movable in the third direction 96. A plurality of hands 122 are spaced apart from each other in a vertical direction, and are individually movable forward and rearward.

The treating module 20 includes a buffer unit 200, a carrying device 300, a liquid treating device 400, and a supercritical device 500. The buffer unit 200 provides a space in which a substrate 'W' is temporarily stored when introduced into the treating module 20 or when withdrawn from the treating module 20. The liquid treating device 400 performs a liquid treatment process of performing liquid treatment for the substrate 'W' by supplying a liquid onto the substrate 'W'. The supercritical device 500 performs a drying process to remove a liquid remaining on the substrate 'W'. The carrying device 300 carries the substrate 'W' between any two of the buffer unit 200, the liquid treating device 400, and the supercritical device 500.

The carrying device 300 is disposed such that the longitudinal direction thereof is provided in the first direction 92. The buffer unit 200 may be interposed between the index module 10 and the carrying device 300. The liquid treating device 400 and the supercritical device 500 may be disposed at a side portion of the carrying device 300. The liquid treating device 400 and the carrying device 300 may be disposed in the second direction 94. The supercritical device 500 and the carrying device 300 may be disposed in the second direction 94. The buffer unit 200 may be positioned at one end of the carrying device 300.

According to an embodiment, liquid treating devices 400 may be disposed at opposite sides of the carrying device 300, and supercritical devices 500 may be disposed at opposite sides of the carrying device 300. The liquid treating devices 400 may be disposed at a position closer to the buffer unit 200 rather than the supercritical devices 500. The liquid treating devices 400 at one side of the carrying device 300 may be arranged in the form of a matrix of A×B ('A' and 'B' are '1s' or natural numbers greater than '1') in the first direction 92 and the third direction 96. The supercritical devices 500 at one side of the carrying device 300 may be arranged in the form of a matrix of C×D ('C' and 'D' are '1s' or natural numbers greater than '1') in the first direction 92 and the third direction 96. Alternatively, only the liquid treating devices 400 may be provided at one side of the carrying device 300, and only the supercritical devices 500 may be provided at an opposite side of the carrying device 300.

The carrying device 300 has a carrying robot 320. A guide rail 340, which has a longitudinal direction provided in the second direction 92, may be provided in the carrying device 300, and the carrying robot 320 may be provided to be movable on the guide rail 340. The carrying robot 320 may include a hand 322 in which the substrate 'W' is positioned, and the hand 322 may be provided to be movable forward and backward, rotatable about the third direction 96, and movable in the third direction 96. A plurality of hands 322 are spaced apart from each other in a vertical direction, and are individually movable forward and rearward.

The buffer unit 200 includes a plurality of buffers 220 to place the substrate 'W'. The buffers 220 may be disposed to be spaced apart from each other in the third direction 96. The buffer unit 200 is open in a front face and a rear face. The front surface faces the index module 10, and the rear surface faces the carrying device 300. The index robot 120 may access the buffer unit 200 through the front face, and the carrying robot 320 may access the buffer unit 200 through the rear surface.

Figure 2:
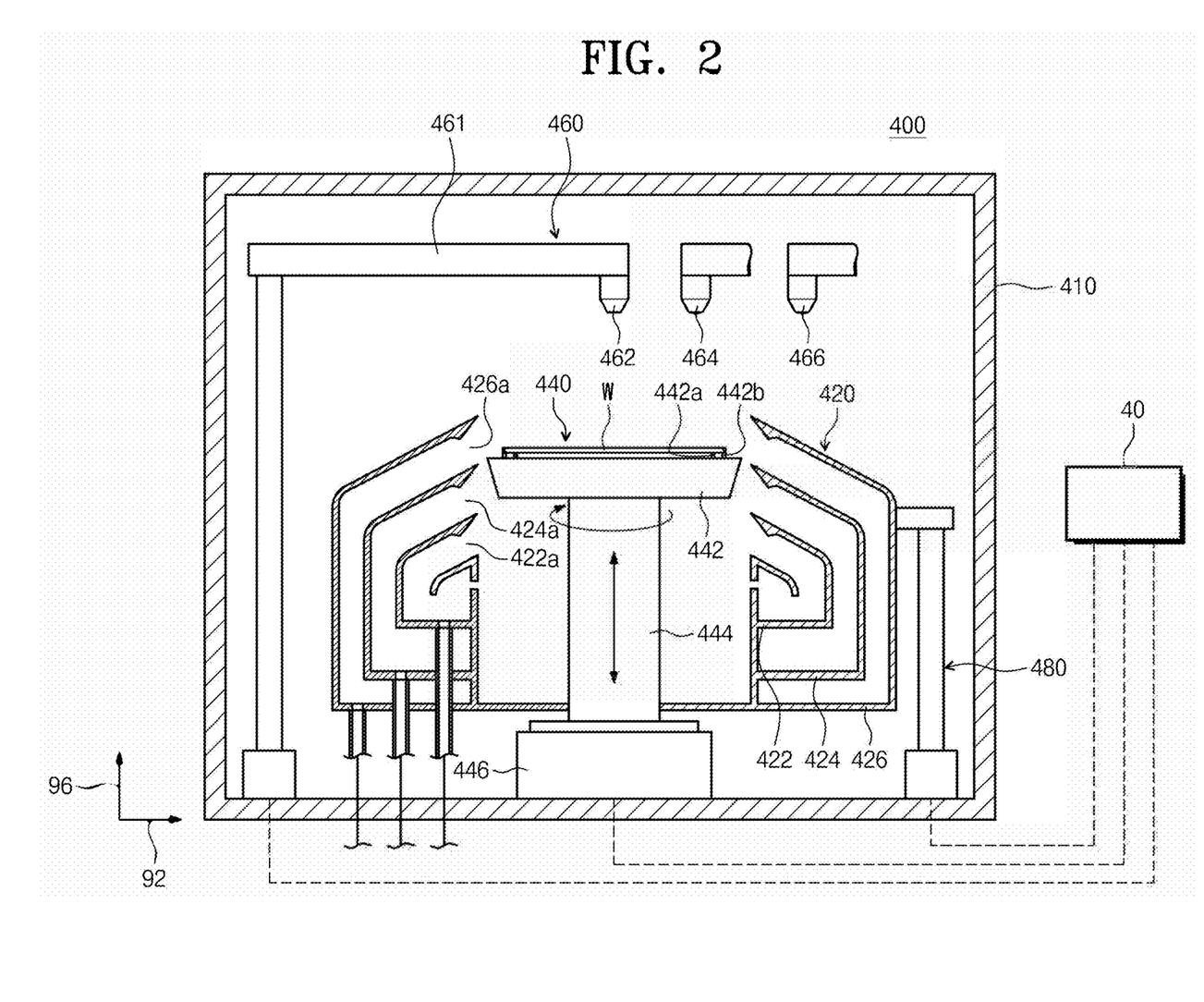
FIG. 2 is a view schematically illustrating a liquid treating device of FIG. 1, according to an embodiment of the inventive concept.

FIG. 2 is a view schematically illustrating the liquid treating device 400 of FIG. 1. Referring to FIG. 2, the liquid treating device 400 includes a housing 410, a cup 420, a support unit 440, a liquid supply unit 460, an elevating unit 480, and a controller 40. The controller 40 controls the operations of the liquid supply unit 460, the support unit 440, and the elevating unit 480. The housing 410 substantially has a rectangular parallelepiped shape. The cup 420, the support unit 440, and the liquid supply unit 460 are provided in the housing 410.

The cup 420 has a treatment space having an open upper portion, and the substrate 'W' is liquid-treated in the treatment space. The support unit 440 supports the substrate 'W' in the treatment space. The liquid supply unit 460 supplies a liquid to the substrate 'W' supported by the support unit 440. Multiple types of liquids may be provided, and sequentially supplied onto the substrate 'W'. The elevating unit 480 may adjust the relative height between the cup 420 and the support unit 440.

According to an embodiment, the cup 420 has a plurality of recovery tubs 422, 424, and 426. Each of the recovery tubs 422, 424, and 426 has a recovery space to recover a liquid used to treat the substrate. Each of the recovery tubs 422, 424, and 426 is provided in the shape of a ring to surround the support unit 440. When the liquid treatment process is performed, a liquid, which is previously treated and scattered by the rotation of the substrate 'W', is introduced into the recovery space through inlets 422a, 424a, and 426a of recovery tubs 422, 424, and 426. According to an embodiment, the cup 420 has a first recovery tub 422, a second recovery tub 424, and a third recovery tub 426. The first recovery tub 422 is provided to surround the support unit 440, the second recovery tub 424 is provided to surround the first recovery tub 422, and the third recovery tub 426 is provided to surround the second recovery tub 424. The second inlet 424a, which is to introduce a liquid into the second recovery tub 424, may be positioned above the first inlet 422a to introduce the liquid to the first recovery tub 422, and the third inlet 426a, which is to introduce the liquid into the third recovery tub 426, may be positioned above the second inlet 424a.

The support unit 440 has a support plate 442 and a driving shaft 444. A top surface of the support plate 442 may be provided in a substantially disk shape, and may have a diameter greater than that of the substrate 'W'. The support plate 442 is provided at the central portion thereof with a support pin 442a to support a rear surface of the substrate 'W', and the support pin 442a has an upper end protruding from the support plate 442 such that the substrate 'W' is spaced apart from the support plate 442 by a specific distance. The support plate 442 has a chuck pin 442b provided at the edge thereof.

The chuck pin 442b is provided to protrude upward from the support plate 442 to support the side portion of the substrate 'W', thereby preventing the substrate 'W' from being separated from the substrate 'W' when the substrate 'W' is rotated. The driving shaft 444 is driven by a driver 446 and connected to the central portion of a bottom surface of the substrate 'W' to rotate the support plate 442 about the central axis thereof.

According to an embodiment, the liquid supply unit 460 has a first nozzle 462, a second nozzle 464, and a third nozzle 466. The first nozzle 462 supplies a first liquid onto the substrate 'W'. The first liquid may be a liquid that removes a film or foreign matters remaining on the substrate 'W'. The second nozzle 464 supplies a second liquid onto the substrate 'W'. The second liquid may be excellently dissolved in a third liquid. For example, the second liquid may be more excellently dissolved in the third liquid than the first liquid. The second liquid may neutralize the first liquid supplied on the substrate 'W'. In addition, the second liquid may neutralize the first liquid and may be more excellently dissolved in the third liquid rather than the first liquid.

According to an embodiment, the second liquid may be water. The third nozzle 466 supplies the third liquid onto the substrate 'W'. The third liquid may be excellently dissolved in a supercritical fluid used in the supercritical device 500. For example, the third liquid may be excellently dissolved in the supercritical fluid used in the supercritical device 500 when compared to the second liquid. According to an embodiment, the third liquid may be an organic solvent. The organic solvent may be isopropyl alcohol (IPA). According to an embodiment, the supercritical fluid may be carbon dioxide.

The first nozzle 462, the second nozzle 464, and the third nozzle 466 are supported on arms 461 different from each other, and the arms 461 may be moved independently. Alternatively, the first nozzle 462, the second nozzle 464, and the third nozzle 466 may be mounted on the same arm and moved simultaneously.

The elevating unit 480 moves the cup 420 in the vertical direction. The relative height between the cup 420 and the substrate 'W' is changed through the vertical movement of the cup 420. Accordingly, since the recovery tubs 422, 424, and 426 to recover the liquid, which is previously treated, are changed depending on the type of a liquid supplied to the substrate 'W', liquids may be separated and recovered. As described above, the cup 420 may be fixedly installed, and the elevating unit 480 may move the support unit 440 in the vertical direction.

Figure 3:
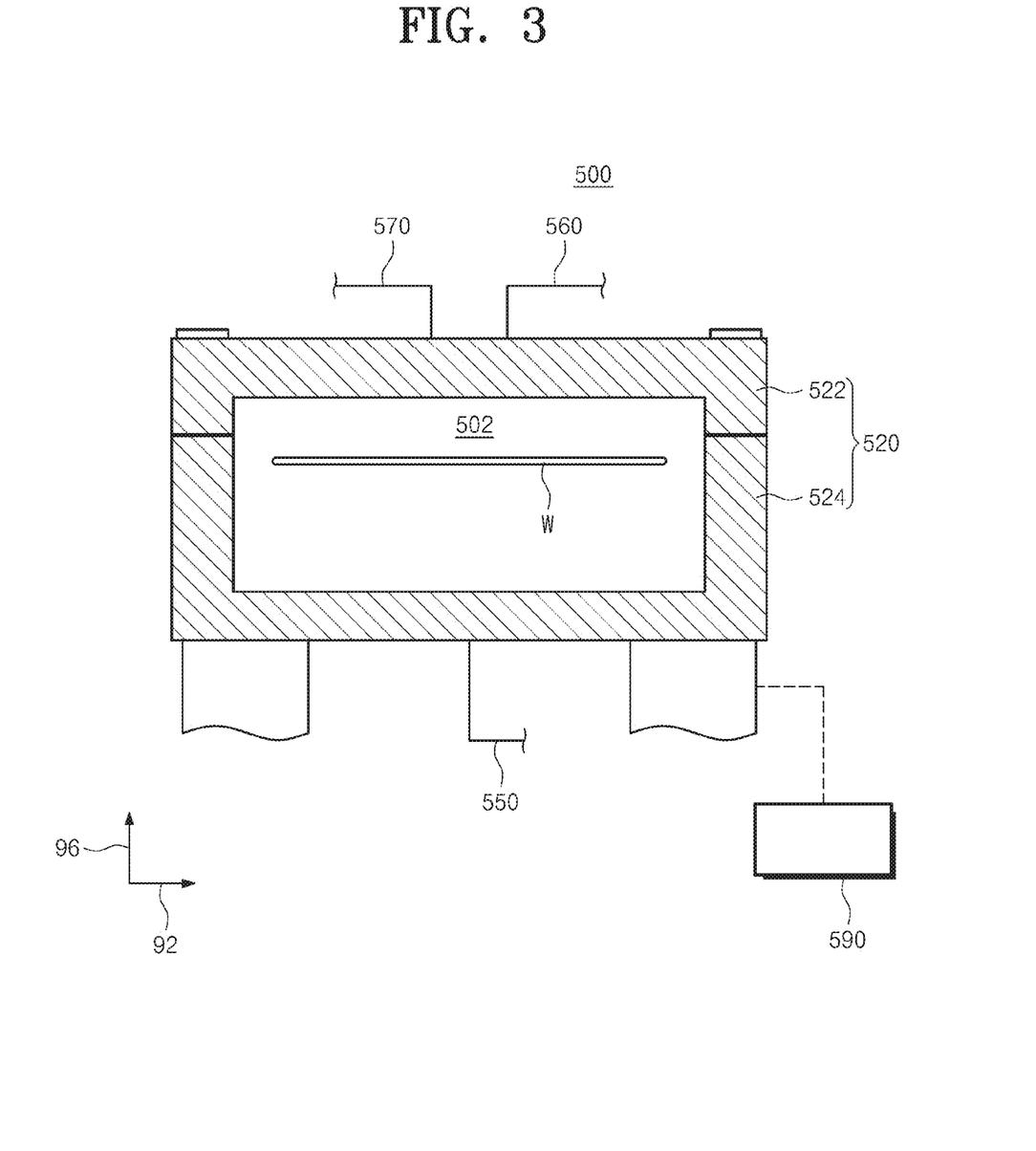
FIG. 3 is a view schematically illustrating a supercritical device of FIG. 1, according to an embodiment of the inventive concept.

FIG. 3 is a view schematically illustrating the supercritical device 500 of FIG. 1, according to an embodiment. According to an embodiment, the supercritical device 500 removes a liquid from the substrate 'W' using the supercritical fluid. According to an embodiment, the liquid on the substrate 'W' is IPA. The supercritical device 500 supplies the supercritical fluid onto the substrate 'W', dissolves the IPA, which is on the substrate 'W', in the supercritical fluid, and removes the IPA from the substrate 'W'. According to an embodiment, the supercritical fluid is $CO_2$ present in a supercritical state.

The supercritical device 500 includes a process chamber 520, a first fluid supply unit 560, a second fluid supply unit 570, a support device (not illustrated), and an exhaust unit 550.

The process chamber 520 provides a treatment space 502 to perform a cleaning process. The process chamber 520 has an upper housing 522 and a lower housing 524, and the upper housing 522 and the lower housing 524 are combined with each other to provide the above-described treatment space 502. The upper housing 522 is positioned on the lower housing 524.

The position of the upper housing 522 is fixed and the lower housing 524 may be moved up and down by a driving member 590 such as a cylinder. When the lower housing 524 is spaced apart from the upper housing 522, the treatment space 502 is open. In this case, the substrate 'W' is introduced or withdrawn.

When the process is performed, the lower housing 524 makes close contact with the upper housing 522 to seal the treatment space 502 from the outside. A heater (not illustrated) is provided inside the wall of the process chamber 520. The heater (not illustrated) heats the treatment space 502 of the process chamber 520 such that the fluid supplied into the inner space of the process chamber 520 is maintained in the supercritical state. The inner part of the treatment space 502 has an atmosphere formed by the supercritical fluid.

A support device (not illustrated) supports the substrate 'W' in the treatment space 502 of the process chamber 520. The substrate 'W' introduced into the treatment space 502 of the process chamber 520 is placed on the support device (not illustrated). According to an embodiment, the substrate 'W' is supported by a support device (not illustrated) such that the pattern surface of the substrate 'W' faces upward.

Figure 4:
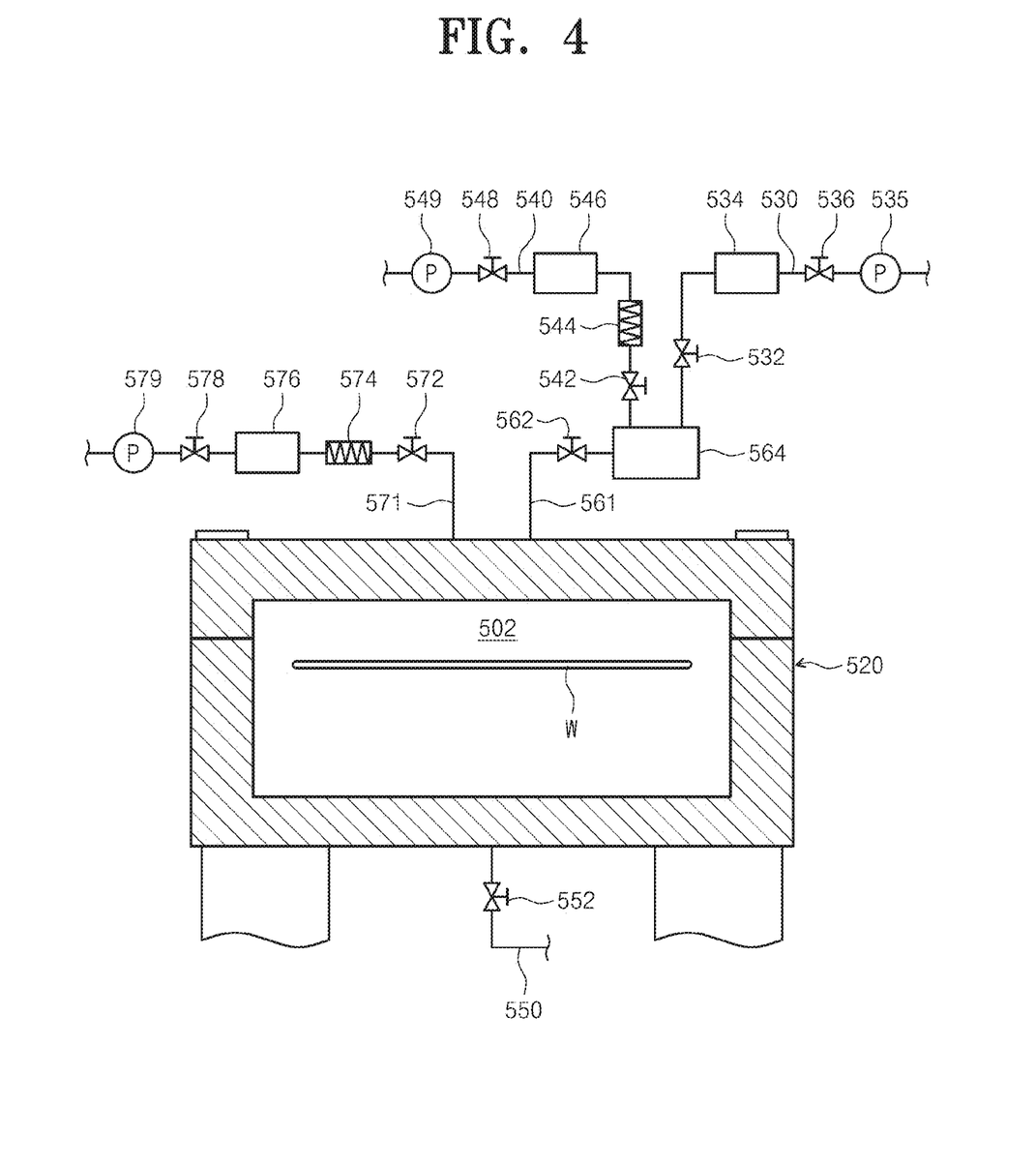
FIG. 4 is a view schematically illustrating a first fluid supply unit and a second fluid supply unit to supply a supercritical fluid, according to an embodiment of the inventive concept.

The first fluid supply unit 560 supplies a supercritical fluid having an organic solvent dissolved therein to the treatment space 502. The second fluid supply unit 570 supplies a supercritical fluid having no organic solvent dissolved therein to the treatment space 502. Although FIG. 4 illustrates that the first fluid supply unit 560 and the second fluid supply unit 570 are coupled to the upper housing 522, both the first fluid supply unit 560 and the second fluid supply unit 570 may be coupled to the lower housing 524 or any one of the first fluid supply unit 560 and the second fluid supply unit 570 may be coupled to the upper housing 522, and a remaining one may be coupled to the lower housing 524.

An exhaust unit 550 is coupled to the lower housing 524. The supercritical fluid in the treatment space 502 of the process chamber 520 is exhausted to the outside of the process chamber 520 through the exhaust unit 550.

The first fluid supply unit 560 supplies the supercritical fluid having an organic solvent dissolved therein to the treatment space 502. The second fluid supply unit 570 supplies the supercritical fluid having no organic solvent dissolved therein to the treatment space 502. Although FIG. 4 illustrates that the first fluid supply unit 560 and the second fluid supply unit 570 are coupled to the upper housing 522, both the first fluid supply unit 560 and the second fluid supply unit 570 may be coupled to the lower housing 524 or any one of the first fluid supply unit 560 and the second fluid supply unit 570 may be coupled to the upper housing 522, and a remaining one may be coupled to the lower housing 524.

The first fluid supply unit 560 includes a first supercritical fluid supply line 540, a solvent supply line 530, a mixing tank 564, a first supply line 561, and a first supply valve 562.

A first pump 549, a first front valve 548, a first reservoir 546, a first heater 544, and a first rear valve 542 are installed on the first supercritical fluid supply line 540. The first reservoir 546 is connected to a supercritical fluid supply source (not illustrated) that supplies $CO_2$, and receives $CO_2$ from the supercritical fluid supply source. The first pump 549 is installed at the front end of the first reservoir 546 to transmit $CO_2$ to the first reservoir 546. The first front valve 548 adjusts the flow rate of $CO_2$ transmitted from the first pump 549 to the first reservoir 546. The first heater 544 heats $CO_2$ to be in a supercritical state. The first rear valve 542 adjusts the flow rate of $CO_2$ supplied to the mixing tank 564.

A second pump 535, a second front valve 536, a second reservoir 534, and a second rear valve 532 are installed on the solvent supply line 530. The second reservoir 534 is connected to an IPA supply source (not illustrated) that supplies IPA, and receives IPA from the IPA supply source. The second pump 535 is installed at the front end of the second reservoir 534 to transmit the IPA to the second reservoir 534. The second front valve 536 adjusts the flow rate of the IPA transmitted from the second pump 535 to the second reservoir 534. The second rear valve 532 adjusts the flow rate of the IPA supplied to the mixing tank 564.

The $CO_2$ supplied from the first supercritical fluid supply line 540 and the IPA supplied from the solvent supply line 530 are mixed in the mixing tank 564. The $CO_2$ and the IPA are mixed in the mixing tank 564 to react with each other while the IPA is being dissolved in the $CO_2$. The internal temperature and the internal pressure of the mixing tank 564 are set such that the $CO_2$ is maintained in the supercritical state. A member, such as a vibration applying device or a heater, may be installed to reduce the time to dissolve the IPA in the $CO_2$ inside the mixing tank 564.

The first supply line 561 is to supply $CO_2$ having IPA dissolved therein from the mixing tank 564 to the treatment space 502. The first supply valve 562 is installed on the first supply line 561 to adjust the flow rate of $CO_2$ having the IPA dissolved therein, which is transmitted to the process chamber 520.

The second fluid supply unit 570 has a second supercritical fluid supply line 571, a third pump 579, a third front valve 578, a reservoir 576, a second heater 574, and a third rear valve 572 installed on the second supercritical fluid supply line 571. The reservoir 576 is connected to a supercritical fluid supply source (not illustrated) that supplies $CO_2$, and receives $CO_2$ from the supercritical fluid supply source. The third pump 579 is installed at the front end of the reservoir 576 to transmit $CO_2$ to the reservoir 576. The third front valve 578 adjusts the flow rate of $CO_2$ transmitted from the third pump 579 to the reservoir 576. The second heater 574 heats $CO_2$ to be in a supercritical state. The third rear valve 572 adjusts the flow rate of $CO_2$ supplied to the treatment space 502.

Each of the mixing tank 564 and the reservoir 576 may store $CO_2$ in the supercritical state. The $CO_2$ stored in the mixing tank 564 may differ from the $CO_2$ stored in the reservoir 576 in terms of temperature, pressure, or density thereof. For example, the first pump 549 and the third pump 579 may be provided such that the pressure of the $CO_2$ transmitted to the first reservoir 546 differs from the pressure of the $CO_2$ transmitted to the reservoir 576. For example, the first pump 549 and the third pump 579 may be provided such that the power of the first heater 544 differs from the power of the second heater 574.

The exhaust unit 550 is coupled to the lower housing 524. The supercritical fluid in the treatment space 502 of the process chamber 520 is exhausted to the outside of the process chamber 520 through the exhaust unit 550.

Figure 5:
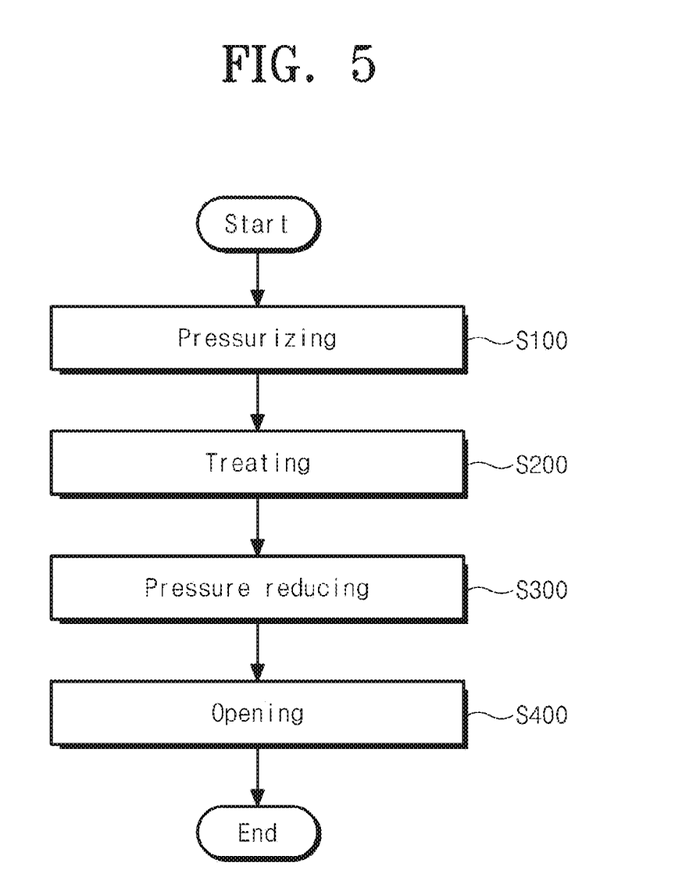
FIG. 5 is a flowchart illustrating a method for treating a substrate, according to an embodiment of the inventive concept.

FIG. 5 is a flowchart illustrating a method for treating a substrate, according to an embodiment of the inventive concept. To perform the method for treating the substrate of the inventive concept, the controller controls the first fluid supply unit 560, the second fluid supply unit 570, and the exhaust unit 550.

Referring to FIG. 5, the method for treating the substrate may include a pressurizing step (S100), a treating step (S200), a pressure reducing step (S300), and an opening step (S400).

When the substrate 'W' is introduced into the treatment space 502, the pressurizing step (S100) is performed. In the pressurizing step (S100), the supercritical fluid is supplied into the treatment space 502 to pressurize the treatment space 502. The pressurizing is performed until the inner part of the treatment space 502 has critical pressure or more to make $CO_2$ in the supercritical state.

In the treating step (S200), the supercritical fluid is supplied into the treatment space 502 to treat the substrate 'W'. The treating step (S200) includes a supplying procedure and an exhausting procedure. The exhausting procedure and the supplying procedure are sequentially performed while being repeated multiple times. The $CO_2$ is supplied into the treatment space 502 in the supplying procedure and the treatment space 502 is exhausted in the exhausting procedure.

In the pressure reducing step (S300), the treatment space 502 is exhausted after the treatment of the substrate 'W' is completed. According to an embodiment, the pressure reducing is performed until the pressure of the treatment space 502 is equal to or similar to normal pressure. When the pressure reducing step (S300) is completed, the opening step (S400) to open the process chamber 520 is performed. When the process chamber 520 is open, the substrate 'W' is withdrawn out of the treatment space 502.

Figure 6:
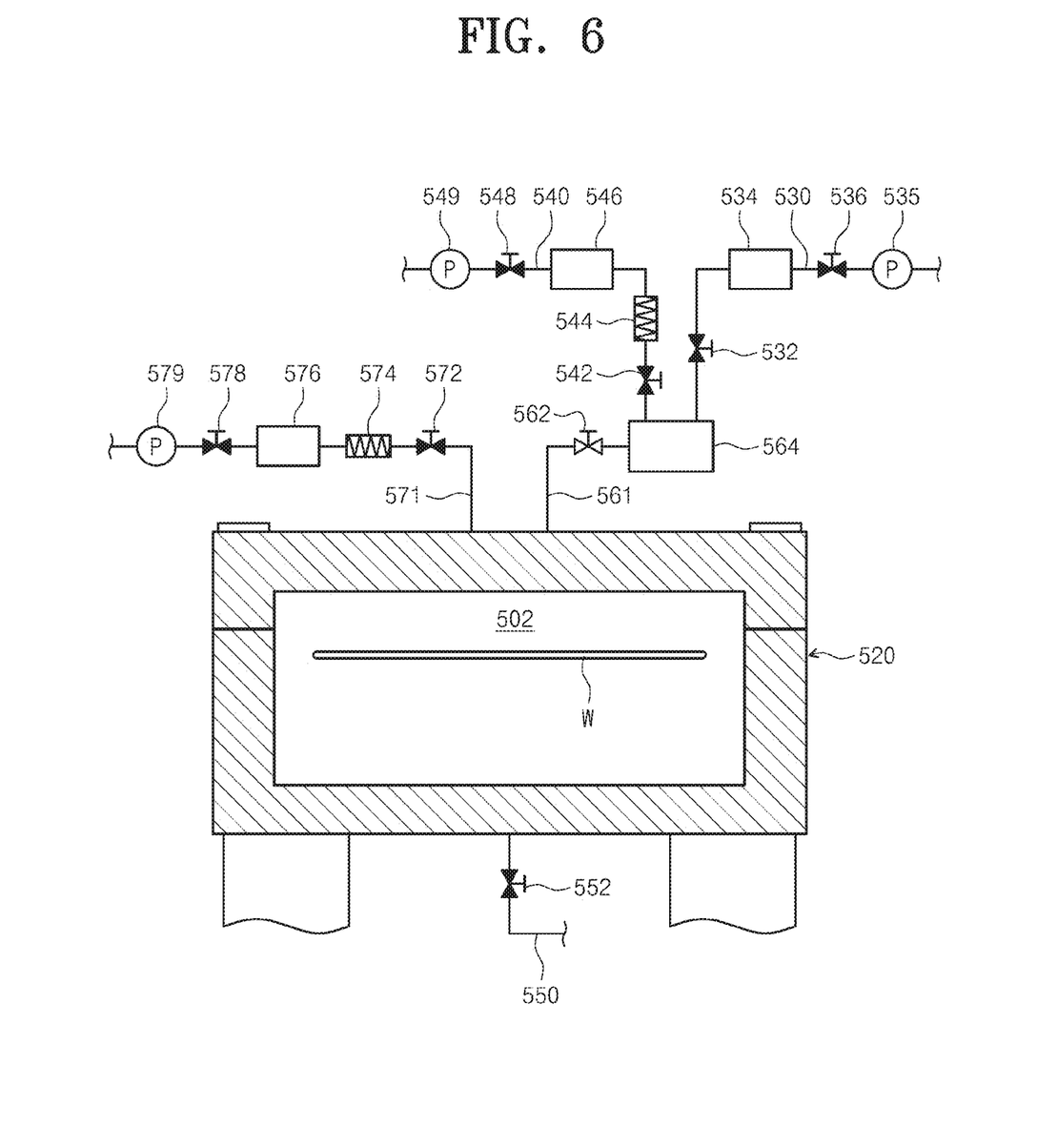
FIG. 6 is a view illustrating that a first fluid supply unit of FIG. 4 supplies a supercritical fluid having an organic solvent dissolved therein to a process chamber in a pressurizing step.

FIG. 6 is a view illustrating that the first fluid supply unit 560 of FIG. 4 supplies $CO_2$ having IPA dissolved therein to the process chamber 520 in a pressurizing step (S100). Referring to FIG. 6, in the pressurizing step (S100), the IPA dissolved in $CO_2$ is supplied to the treatment space 502. For example, the mixing ratio of $CO_2$ supplied to the treatment space 502 and having the IPA, which is dissolved therein, is adjusted such that the content of IPA is 1 wt % or less in the treatment space 502. In one embodiment, the IPA may be provided to be 0.5 wt % in processing space 502. Valves other than the first supply valve 562 are closed in the pressurizing step S100.

Figure 7:
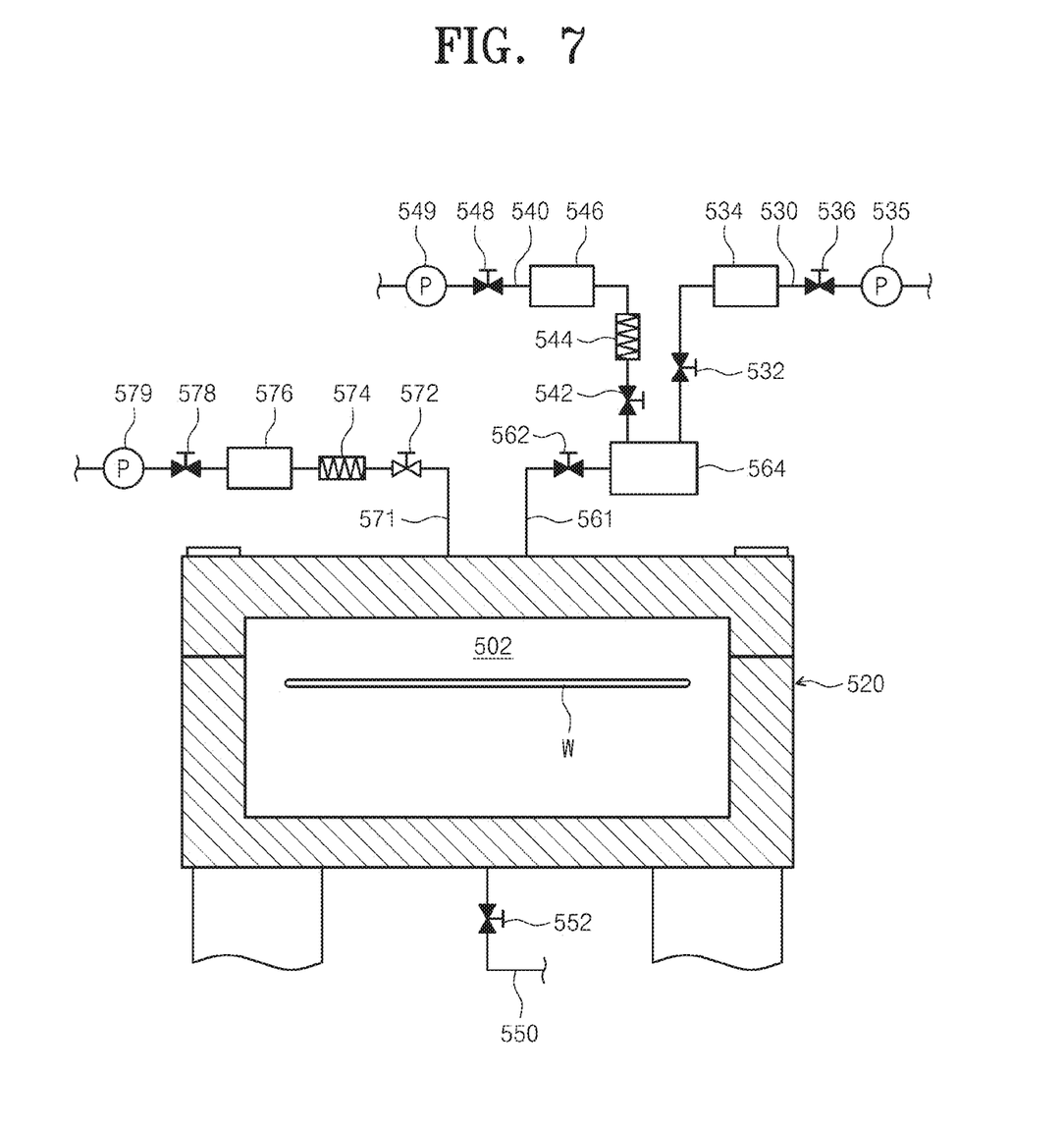
FIG. 7 is a view illustrating that a first fluid supply unit of FIG. 4 supplies a supercritical fluid having no organic solvent dissolved therein to a process chamber in a treating step.

FIG. 7 is a view illustrating that the second fluid supply unit of FIG. 4 supplies a supercritical fluid having no organic solvent dissolved therein to the process chamber 520 in the treating step. Referring to FIG. 7, only a supercritical fluid is supplied to the treatment space 502 without an organic solvent in the supplying procedure of the treating step S200. The exhausting procedure of the treating step (S200) is illustrated in FIG. 8.

For example, on the assumption that the pressure of the treatment space 502 is P1 in the supplying procedure of the treating step (S200), and the pressure of the treatment space 502 is P2 in the pressurizing step (S100), P1 may be equal to or smaller than P2. For example, P2 may be equal or different in the repeated supplying procedure.

The $CO_2$ having no IPA dissolved therein is supplied to the treatment space 502 in the treating step (S200), and the dissolution of the IPA in the $CO_2$ is promoted by applying physical force to the $CO_2$ supplied in the pressurizing step (S100).

Figure 8:
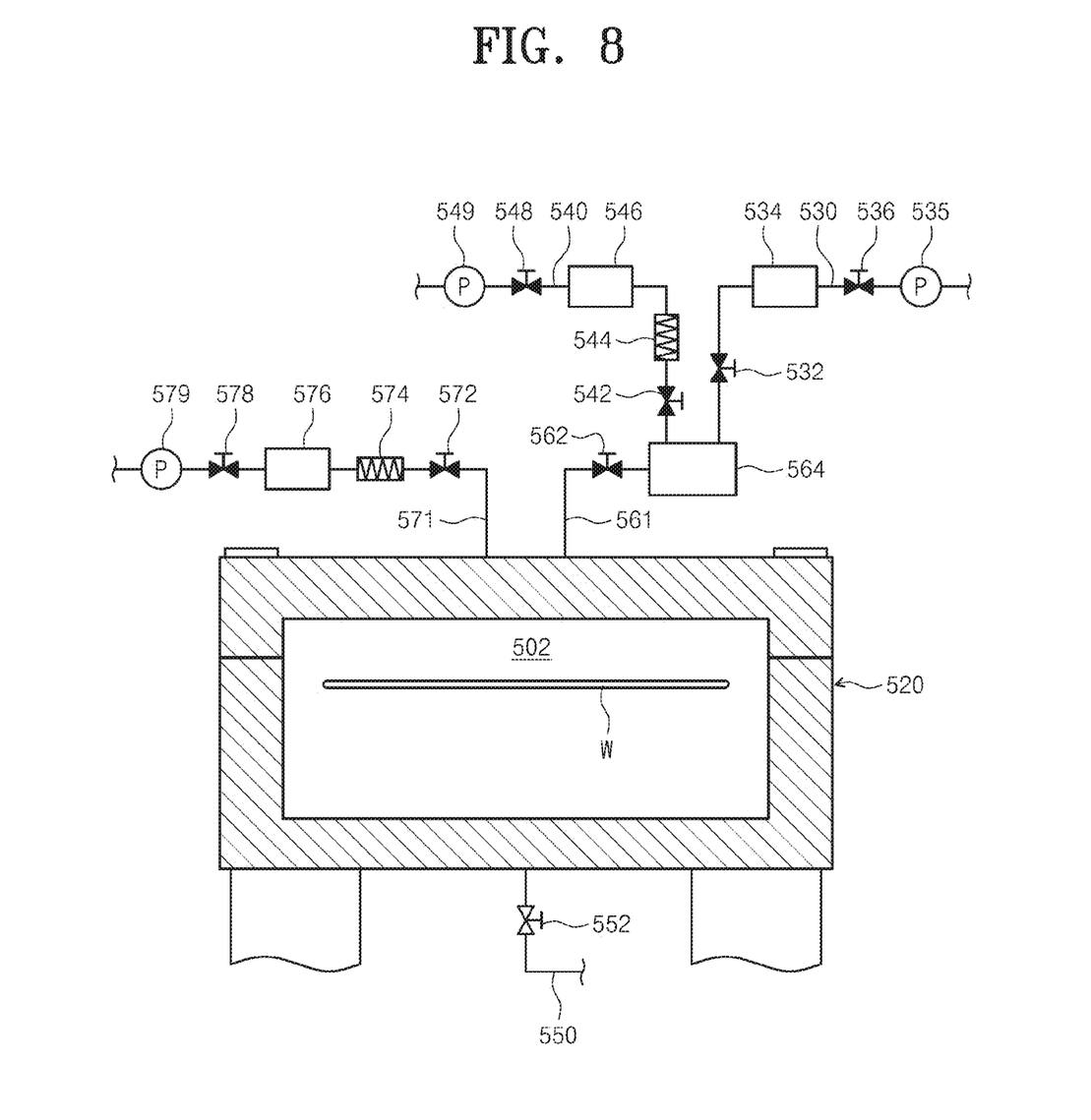
FIG. 8 is a view illustrating that an exhaust unit of FIG. 4 exhausts a process chamber in an exhausting step.

FIG. 8 is a view illustrating that an exhaust unit of FIG. 4 exhausts the process chamber 520 in an exhausting step. Referring to FIG. 8, the exhaust valve 552 installed on the exhaust unit 550 is open, and the valves provided in the first fluid supply unit 560 and the second fluid supply unit 570 are closed to exhaust the treatment space.

According to an embodiment, $CO_2$ having organic solvent dissolved therein is supplied to the treatment space 502 in the pressurizing step (S100), thereby preventing the organic solvent from being dried in the treatment space 502 before dissolving the organic solvent in the $CO_2$. Accordingly, the leaning phenomenon may be prevented and an amount of an organic solvent used may be reduced in a procedure of wetting the substrate using the organic solvent.

In addition, according to the inventive concept, as $CO_2$ having organic solvent dissolved therein is supplied to the treatment space 502 in the pressurizing step (S100), the reaction rate between the organic solvent and the $CO_2$ is increased, so time necessary to dissolve the organic solvent in $CO_2$ may be reduced.

In addition, according to the inventive concept, as $CO_2$ having the organic solvent dissolved therein is supplied to the treatment space 502 in the pressurization step (S100), the reaction between the organic solvent and the $CO_2$ is smoothly performed, thereby minimizing the organic solvent remaining on the substrate.

In addition, according to the inventive concept, $CO_2$ having organic solvent dissolved therein is supplied to the treatment space 502 in the pressurization step (S100), and $CO_2$ having no organic solvent dissolved therein is supplied to the treatment space 502 in the treating step (S200). Accordingly, the number of times of repeating the supplying procedure and the exhausting procedure in the treating step (S200) may be reduced, thereby reducing the process time.

According to an embodiment of the inventive concept, there may be provided an apparatus and a method for treating a substrate, capable of improving the treatment efficiency for the substrate when drying the substrate using the supercritical fluid.

According to an embodiment of the inventive concept, the organic solvent, which is not dissolved in the supercritical fluid may be prevented from being dried, when drying the substrate using the supercritical fluid.

According to an embodiment of the inventive concept, the process time may be reduced when the substrate is dried using the supercritical fluid.

The effects produced in the inventive concept are not limited to the aforementioned effects, and any other effects not mentioned herein will be clearly understood from the detailed description and accompanying drawings by those skilled in the art to which the inventive concept pertains.

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to limit the inventive concept to the disclosed embodiments Furthermore, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for treating a substrate, the method comprising:
    performing a liquid treatment process for the substrate by supplying a first organic solvent onto the substrate in a liquid treating device;
    carrying the substrate from the liquid treating device to a supercritical device; and
    performing a drying process to remove the first organic solvent remaining on the substrate in the supercritical device,
    wherein the drying process comprises
        supplying a supercritical fluid having a second organic solvent dissolved therein to a treatment space after introducing the substrate into the treatment space inside the supercritical device, and
        subsequently, supplying the supercritical fluid having no organic solvent dissolved therein to the treatment space.

2. The method of claim 1, wherein the method further comprising:
    pressurizing the treatment space by supplying the supercritical fluid after the substrate is introduced into the treatment space;
    treating the substrate using the supercritical fluid by supplying the supercritical fluid to the treatment space; and
    reducing pressure by exhausting the supercritical fluid out of the treatment space after the substrate is treated,
    wherein the supplying the supercritical fluid having the second organic solvent dissolved therein to the treatment space is performed in the pressurizing the treatment space.

3. The method of claim 2, wherein the supplying the supercritical fluid having no organic solvent dissolved therein to the treatment space is performed in the treating the substrate using the supercritical fluid.

4. The method of claim 1, wherein the supercritical fluid is carbon dioxide ($CO_2$).

5. The method of claim 1, wherein the first organic solvent and the second organic solvent are isopropyl alcohol (IPA).

6. A method for treating a substrate, the method comprising:
    performing a liquid treatment process on the substrate; and
    performing a drying process on the substrate to remove a liquid remaining on the substrate after the liquid treatment process, the drying process comprising
        sequentially performing pressurizing a treatment space by supplying a supercritical fluid after the substrate is introduced into the treatment space,
        treating the substrate using the supercritical fluid by supplying the supercritical fluid to the treatment space, and
        reducing pressure by exhausting the supercritical fluid out of the treatment space after the substrate is completely treated,
    wherein the supercritical fluid and an organic solvent are simultaneously supplied to the treatment space in the pressurizing the treatment space.

7. The method of claim 6, wherein the pressurizing includes:
    supplying the organic solvent to the treatment space in a state that the organic solvent is dissolved in the supercritical fluid.

8. The method of claim 6, wherein the treating includes:
    supplying only the supercritical fluid to the treatment space, without the organic solvent.

9. The method of claim 6, wherein the pressurizing includes:
    adjusting a mixing ratio of the supercritical fluid supplied to the treatment space and having the organic solvent, which is dissolved in the supercritical fluid, such that the organic solvent is provided to be 1 wt % or less in the treatment space.

10. The method of claim 6, wherein the supercritical fluid is carbon dioxide ($CO_2$).

11. The method of claim 6, wherein the organic solvent is isopropyl alcohol (IPA).

12. A method for treating a substrate, the method comprising:
   treating the substrate with an organic solvent; and
   drying the substrate after the treating by removing the organic solvent, which remains on the substrate, by supplying a supercritical fluid onto the substrate,
   wherein the removing comprises simultaneously supplying the supercritical fluid and the organic solvent to a treatment space.

13. The method of claim 12, wherein the treating of the substrate includes:
   introducing the substrate into the treatment space; and
   supplying, to the treatment space, the supercritical fluid having the organic solvent dissolved in the supercritical fluid.

14. The method of claim 12, further comprising:
   introducing the substrate into the treatment space;
   supplying, to the treatment space, the supercritical fluid having the organic solvent dissolved in the supercritical fluid; and
   supplying the supercritical fluid having no organic solvent dissolved in the supercritical fluid to the treatment space.

15. The method of claim 14, further comprising:
   supplying, to the treatment space, the supercritical fluid having the organic solvent dissolved in the supercritical fluid, after the organic solvent is dissolved in the supercritical fluid outside the treatment space.

16. The method of claim 14, further comprising:
   adjusting a mixing ratio of the supercritical fluid supplied to the treatment space and having the organic solvent dissolved in the supercritical fluid such that the organic solvent is provided to 1 wt % or less in the treatment space.

17. The method of claim 12, wherein the treating of the substrate is performed by repeatedly supplying the supercritical fluid to the treatment space and exhausting the treatment space.

18. The method of claim 12, wherein the supercritical fluid is carbon dioxide ($CO_2$).

19. The method of claim 12, wherein the organic solvent is isopropyl alcohol.

20. The method of claim 1, wherein the first organic solvent and the second organic solvent are a same kind of organic solvent.

* * * * *